(12) United States Patent
Venrooij et al.

(10) Patent No.: US 10,699,924 B2
(45) Date of Patent: Jun. 30, 2020

(54) MODULAR SYSTEM FOR MOULDING ELECTRONIC COMPONENTS AND KIT-OF-PARTS FOR ASSEMBLING SUCH A MODULAR SYSTEM

(71) Applicant: Besi Netherlands B.V., Duiven (NL)

(72) Inventors: Johannes Lambertus Gerardus Maria Venrooij, Duiven (NL); Jeroen Kleijburg, Elst (NL)

(73) Assignee: Besi Netherlands B.V., Duiven (NL)

( * ) Notice: Subject to any disclaimer, the term of this patent is extended or adjusted under 35 U.S.C. 154(b) by 312 days.

(21) Appl. No.: 15/573,321

(22) PCT Filed: May 10, 2016

(86) PCT No.: PCT/NL2016/050332
§ 371 (c)(1),
(2) Date: Nov. 10, 2017

(87) PCT Pub. No.: WO2016/182438
PCT Pub. Date: Nov. 17, 2016

(65) Prior Publication Data
US 2018/0068874 A1 Mar. 8, 2018

(30) Foreign Application Priority Data
May 13, 2015 (NL) .................................... 2014802

(51) Int. Cl.
*H01L 21/67* (2006.01)
*H01L 21/677* (2006.01)
(Continued)

(52) U.S. Cl.
CPC .......... *H01L 21/6719* (2013.01); *B29C 43/18* (2013.01); *B29C 43/34* (2013.01);
(Continued)

(58) Field of Classification Search
CPC ......... B29C 43/58; B29C 43/50; B29C 43/34; B29C 43/18; B29C 43/0084;
(Continued)

(56) References Cited

U.S. PATENT DOCUMENTS 4,872,825 A * 10/1989 Ross ....................... B29C 43/18
425/117
5,654,017 A 8/1997 Harmsen
(Continued)

FOREIGN PATENT DOCUMENTS

EP 0713246 A1 5/1996
JP 01144636 A 6/1989
(Continued)

*Primary Examiner* — Nahida Sultana
(74) *Attorney, Agent, or Firm* — The Webb Law Firm

(57) ABSTRACT

The invention relates to a modular system for moulding electronic components, comprising at least three separate system modules; a press module for moulding the electronic components; a loader module for loading the electronic components to be moulded from a cassette to a press module; and a service module configured to at least partially control each of the other system modules. The invention also relates to a kit-of-parts for assembling such a modular system.

17 Claims, 4 Drawing Sheets

(51) Int. Cl.
  *B29C 43/18* (2006.01)
  *B29C 43/34* (2006.01)
  *B29C 43/50* (2006.01)
  *B29C 43/58* (2006.01)
  *B29C 45/00* (2006.01)
  *B29C 45/03* (2006.01)
  *B29C 45/14* (2006.01)
  *B29K 63/00* (2006.01)
  *B29L 31/34* (2006.01)

(52) U.S. Cl.
  CPC .............. *B29C 43/50* (2013.01); *B29C 43/58* (2013.01); *B29C 45/0084* (2013.01); *H01L 21/67126* (2013.01); *H01L 21/67772* (2013.01); *H01L 21/67778* (2013.01); *B29C 45/03* (2013.01); *B29C 45/14655* (2013.01); *B29C 2043/182* (2013.01); *B29K 2063/00* (2013.01); *B29L 2031/3406* (2013.01)

(58) Field of Classification Search
  CPC ............. H01L 21/6719; H01L 21/6778; H01L 21/6772; H01L 21/67126
  See application file for complete search history.

(56) References Cited

U.S. PATENT DOCUMENTS

| | | | | |
|---|---|---|---|---|
| 6,178,361 | B1* | 1/2001 | George | H01L 21/6719 414/217 |
| 2003/0140492 | A1* | 7/2003 | Venrooij | H01L 21/67126 29/855 |
| 2004/0194803 | A1* | 10/2004 | Ho | H01L 21/565 134/6 |
| 2009/0162467 | A1* | 6/2009 | Uragami | B29C 43/18 425/139 |
| 2011/0195140 | A1* | 8/2011 | Ho | B29C 31/006 425/185 |
| 2015/0259786 | A1* | 9/2015 | Ko | H01L 51/5253 118/50.1 |

FOREIGN PATENT DOCUMENTS

| | | |
|---|---|---|
| JP | 07032414 A | 2/1995 |
| JP | 2008238424 A | 10/2008 |
| JP | 2014100828 A | 6/2014 |
| JP | 2014222711 A | 11/2014 |

* cited by examiner

MODULAR SYSTEM FOR MOULDING ELECTRONIC COMPONENTS AND KIT-OF-PARTS FOR ASSEMBLING SUCH A MODULAR SYSTEM

CROSS-REFERENCE TO RELATED APPLICATIONS

This application is the United States national phase of International Application No. PCT/NL2016/050332 filed May 10, 2016, and claims priority to Dutch Patent Application No. 2014802 filed May 13, 2015, the disclosures of which are hereby incorporated in their entirety by reference.

BACKGROUND OF THE INVENTION

Field of the Invention

The present invention relates to a modular system of production modules for moulding electronic components. The invention also relates to a kit-of-parts for assembling such a modular system.

Description of Related Art

The moulding of electronic components mounted on a carrier refers to the process of at least partial encapsulating electronic components, and more particularly relates normally the moulding of semiconductor circuits (chips)/integrated circuits (IC's). According to the prior art the moulding of the electronic components takes place in a moulding press provided with at least two co-operating mould parts. Into at least one of the mould parts one or plural mould cavities are recessed. The electronic components are held by a carrier, which carrier may have different shapes like for instance—and not limitative—a lead frame, a board (like a BGA) or a wafer. The carrier with electronic components for encapsulating are placed between the mould parts, which are moved towards each other, e.g. such that they clamp the carrier. A, normally heated, liquid moulding material is pressed into the recesses or mould cavities, e.g. by transfer moulding material (also referred to as epoxy or resin) or by compressing moulding material already placed in the mould before the closure of the mould parts. After at least partial (chemical) curing of the moulding material in the mould cavity/cavities, the mould parts are moved apart and the carrier with encapsulated electronic components is removed from the encapsulating press. In a subsequent processing step the encapsulated products may be separated from each other, for instance by sawing, laser cutting and/or water cutting. The at least partial covered electronic components may be used in various applications. This method of moulding is practised on large industrial scale and enables well controlled moulding of electronic components. Moulding equipment for moulding electronic components knows several levels of automation and also the capacity of the moulding equipment available in the market differs substantially.

The present invention has for its object to provide a modular system of production modules for moulding electronic components that provides the opportunity of efficient change of functionality and capacity of moulding equipment for moulding electronic components.

SUMMARY OF THE INVENTION

This object is achieved with a modular system for moulding electronic components, comprising at least three separate system modules, said system modules comprises: at least one press module for moulding the electronic components; at least one loader module for loading the electronic components to be moulded from a cassette to a press module; and a service module including an intelligent electronic control system configured to at least partially control each of the other system modules; wherein the system modules are provided with cooperating couplings for mutual orientation and securing of adjacent system modules and wherein the cooperating couplings of the system modules are configured to orientate and secure adjacent system modules in-line, i.e. the system modules being positioned in a row, i.e. either being positioned one behind the other or next to each other. The modular system is further characterized in that the cooperating couplings of the at least one press module serve as a point of reference, e.g. fiducial, for mutual orientation and securing of adjacent system modules. The service module is provided with an electronic control system for controlling at least a part of the operation of each of the further modules apart from the service module that are present in the modular system.

One of the advantages of the modular system according the present invention is, that it provides and combines flexibility and scalability at the same time on plural levels. A first advantage is that the production capacity is scalable, among others by the number of press modules incorporated in the system but also by the capacity of other modules (e.g. loader and off-loader modules). In an embodiment of the modular system two press modular provided but also more press modules may be part of a single modular system like for instance three press modules, four press modules, five press modules or even more than five press modules. A second and important advantage is that the automation level may be modular influenced in relative small increasing steps by the type of modules incorporated in the system (e.g. by including or excluding modules like off-loader module feed module, which will be explained later in the description in more detail). A third advantage of substantial relevance is that the type of products that can be processed on the modular system may be influenced (e.g. by changing or adding loader module and off-loader module) for moulding electronic components placed on boards (like BGA), carriers like E-WLP for fan-out packaging, leadframes or even electronic components stacked or etched on silicon-, ceramic- or glass-wafers. A fourth important advantage is that the system even may vary in relation to the type of moulding process that takes place. Press modules may be applied with top mould, bottom mould and moulding material feed, e.g. a transfer moulding press for over-moulding as well as exposed die moulding, but also alternatives like compression moulding press are possible within the boundaries of the present invention. As thus is demonstrated by the four advantages listed above the flexibility and scalability of the modular system provides plural levels of freedom. This makes it easier to decide to buy a modular system as the system may be capacity and the functionality of the modular system may be adapted during the life time of the equipment when production circumstances may vary. Due to the standardisation it is even an option that system modules may later be sold if they become superfluous as they may easy be integrated in other modular systems according the present invention.

By providing a system wherein the cooperating couplings of the at least one press module serve as a point of reference for mutual orientation and securing of adjacent system modules, the modular system according to the present invention is easy and reliable to realise. By providing a press module which is used as the starting point of the modular system to be assembled, the assembling of the modular system is robust and reliable. Even so, reassembling the modular system of the present invention will not result in unforeseen and unintentional misalignment of crucial system modules, such as the press module and adjacent system modules.

A further advantage is that the flexibility is also very easy to realise. The service module that is configured to at least partially control each of the other modules of the modular system enables very simple expansion (enlargement) or adaptation (adjustment) of the system. As far a present, press module(s), loader module, off-loader module, feed module, open-cassette loader and off-loader as well as enclosed cassettes modules by FOUP-loader and FOUP-off-loader module (the different type of modules will be explained later in this description) are all at least partially controlled by the service module.

The controlling service module provides easy "plug and play" of further modules by electronically coupling them to the system (or uncoupling superfluous modules). In line with the easy expansion or adaptation of the electronic control of the modular system according the present invention also mechanical expansion or adaptation of the modular system is simple as the cooperating couplings the system modules are provided with enable simple orienting and securing the modules in-line. For this purpose on at least one side the loader module may be provided with couplings for orienting and securing the loader module in-line to the press module. According the present invention thus both simple electronic and physical coupling and decoupling are facilitated.

In an embodiment the system may further comprise at least one off-loader module for off-loading moulded electronic components from the press into a cassette, which off-loader module is on at least one side provided with couplings for mutual orientation and securing the off-loader module to a press module. The basic configuration of the modular system comprises a press module, a loader module and a service module. The service module may be combined in one unit (combined use of a "single module" floor area) with the loader unit as the loader module and the service module require less volume than a press module. The reason these modules are part of a basic configuration of the modular system is that no moulding is possible without a press module and a service module. Furthermore the electronic components to be moulded a so vulnerable that manual loading is not an option and also the economic argument that the additional functionality of the service module is only beneficial if more than only a single press module is used. In case of a system including more than one press module, the press module and off-loader may be secured to by the couplings in the press module placed in-line on the largest distance of the loader module.

In a further embodiment the system may further comprise at least one feed module for feeding encapsulating material to a press module. Feeding of the moulding material may be embodied as a pellet feeder (especially for transfer moulding processes) but also alternative feed modules may be provided like for instance a liquid moulding material feed module and/or a feed module for compression moulding that feeds sized moulding material bodies (like for instance moulding material sheets) to the press module. In line with the possibility to integrate the loader module with the service module the feed module may be integrated into the off-loader module with the additional advantage that a feed module is normally providing more hinder to the clean room conditions and thus integration of the feed module with a module wherein the products are less vulnerable is positive for creating optimal process conditions. A traditional pellet feed is normally provided with external pellet hopper, weight detection, filter unit and various other additional functions.

In yet another embodiment of the modular system according the present invention the system may further comprise a FOUP-loader module for loading wafers with electronic components to be moulded, from a FOUP-carrier to an adjoining module. A FOUP-carrier is a "Front Opening Universal Product carrier" and is used for loading wafers. The FOUP-loader incorporated in the modular system according the present invention may be of dedicated design or may be an "off the shelf product" as far as the interfaces as applied in the modular system according the present invention are provided; the provision to couple the FOUP-loader to the service module and the cooperating couplings for mutual orientation and securing of adjacent system modules. In line with the FOUP-loader the system may also comprise a FOUP-off-loader module for offloading moulded wafers with electronic components from an adjoining module to a FOUP-cassette.

The loader module may comprise a loader head, which loader head is configured to extend into at least one press module. In a specific embodiment the loader module may cooperate with a guide extending along and carried by one or more press modules. In the situation an additional press module is added to the modular system the guide will then also be extended with one press module width so the loader head of the loader module as such does not require any modification in such situation. A technical solution that enables very simple adaption of the (capacity) configuration of the modular system. For similar reasons also an off-loader module—if part of the modular system—may comprise a cleaning and off-loader head, which cleaning and off-loader head is configured to extend into at least one press module. Also such off-loader head may cooperate with a guide extending along and carried by the at least one press module, however also a single guide for both a loader head and an off-loader head may be applied. The press modules may therefore be provided with cooperating guide parts. Again a technical solution that enables very simple adaption of the (automation level) configuration of the modular system. As for the loader head and the off-loader head they may be provided with a head to handle for instance substrates or leadframes but the loader head and the off-loader head may also be configured to handle wafer type of carrier.

A further option may be to provide each press module with a housing of which the opposite sides are provided with coverable transfer openings. Such coverable transfer openings may be provided to be covered, preferably by clear corresponding safety windows and/or partial metal windows, in situations wherein no exchange of products through an opening is required, e.g. when a press module on one side is not provided with an adjoining module, but on the other hand the opening may be opened for unhindered transfer of products through an opening if and when two neighbouring modules require exchange of product between the modules. This feature also supports all the automation levels from manual operated machine, through partial automation by automatic product loading, up to the maximum level of full automatic product offloading, and/or additional automation of pellet- or liquid epoxy feed.

For even further enhanced simplicity in the extension or the reduction of a modular system according the present invention as far as that they are present, press module(s), service module, loader module and off-loader module may have an identical width.

To enable secure and solid coupling of press modules the couplings provided onto the press module may be integral part of the press structure as the press structure (the "frame") controls the positioning of the "hart" of the moulding process this provides the possibility to more secure alignment of adjacent modules to a press module. For easy coupling of the relative heavy modules without special tools (especially the press modules are heavy, normally at least several tons) the couplings may comprise male and female coupling elements. Furthermore the engaging couplings may also include bolds for securing the adjoining modules together before optimal inline positioning is competed at the time of assembly installation of the equipment.

In a simple yet reliable construction a press module may comprise on opposite sides of the module two couplings, which two couplings are horizontal or even all couplings of the system modules are located in one horizontal plane. This provides the possibility for accurate horizontal relative positioning of the modules of a modular system yet is also enables the correct small deviations in the modules and/or disturbing environmental conditions at the time of installation or during production.

The present invention also provides a kit-of-parts for assembling the modular system according the present invention, comprising: at least one press module for moulding the electronic components; at least one loader module for loading the electronic components to be moulded from a cassette to a press module, a service module including an intelligent electronic control system configured to at least partially control each of the other system modules, wherein the system modules are provided with cooperating couplings for mutual orientation and securing of adjacent system modules and wherein the cooperating couplings of the system modules are configured to orientate and secure adjacent system modules in-line, characterized in that the cooperating couplings of the at least one press module serve as a point of reference for mutual orientation and securing of adjacent system modules. With such kit-of-parts the modular system according the present invention may be realised and thus the advantages of such modular system. In relation to the advantages of the kit-of-parts according to the present invention reference is made to the advantages already mentioned above in relation to the modular system according to the present invention.

BRIEF DESCRIPTION OF THE DRAWINGS

The present invention will be further elucidated on the basis of the non-limitative exemplary embodiments shown in the following figures. Herein shows.

DETAILED DESCRIPTION OF THE INVENTION

Figure 1:
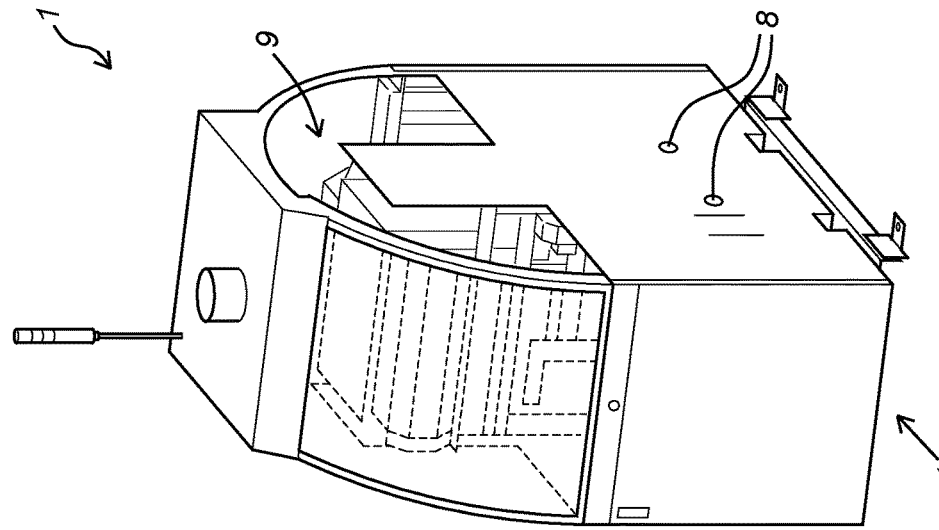
FIG. 1 a perspective view on a kit-of-parts for assembling the minimal configuration of a modular system according the present invention.
Figure 1:
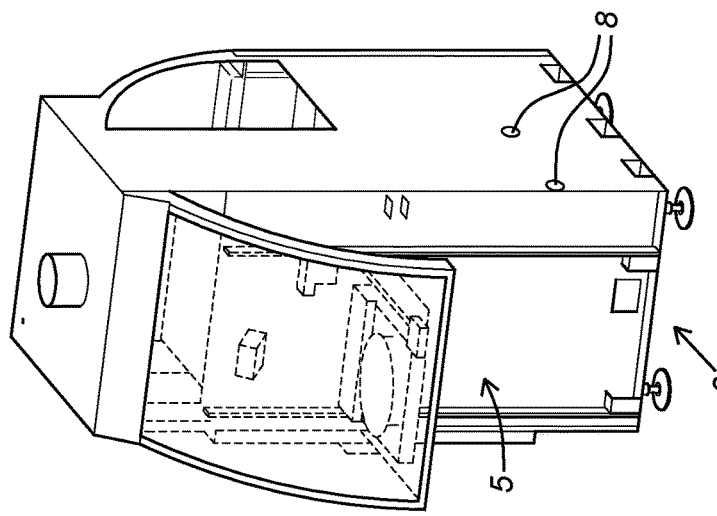
Figure 1:
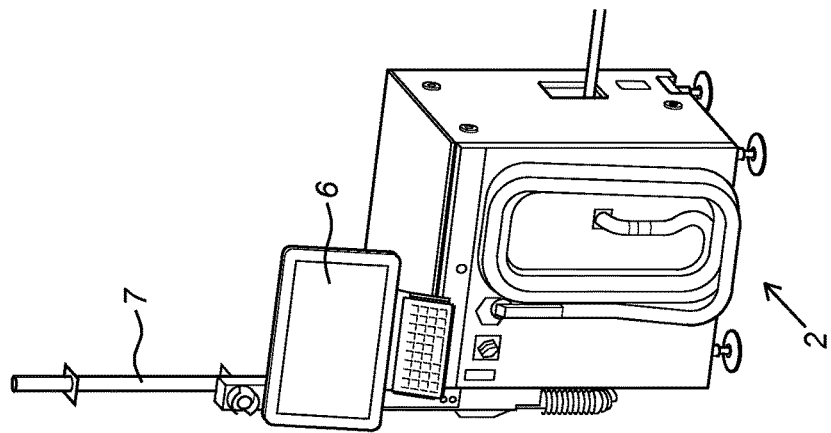
Figure 2:
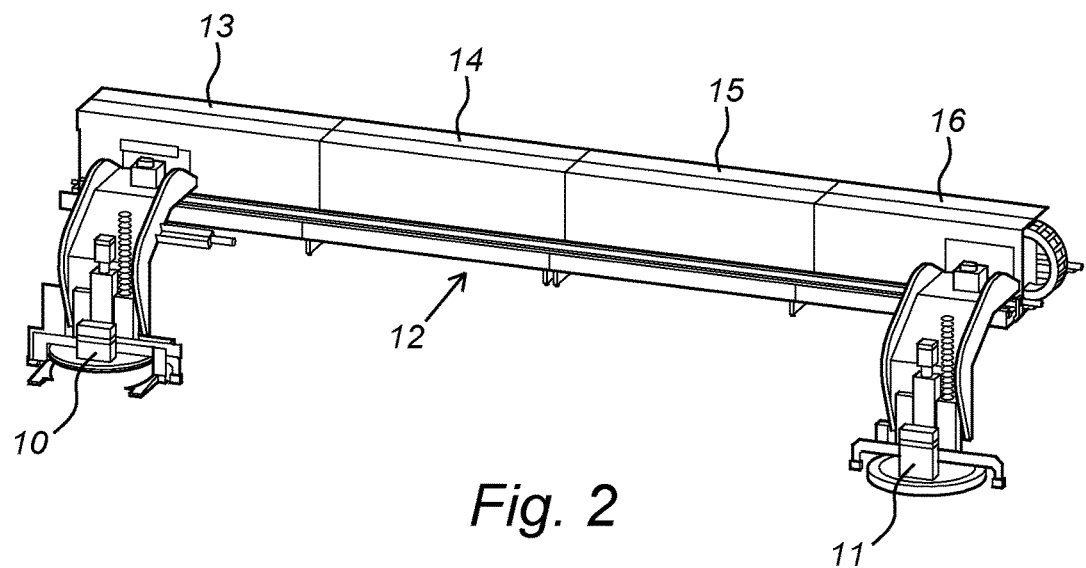
FIG. 2 a perspective view on a loader head and an off-loader head including a guide structure to guide the heads along the modular system.

FIG. 1 shows a perspective view on a kit-of-parts 1 for assembling the minimal configuration of a modular system for moulding electronic component comprising a service module 2 with an intelligent electronic control system for controlling all the other system modules of a modular moulding system, a loader module 3 for loading the electronic components to be moulded from a cassette and a press module 4 for moulding the electronic components. The loader module 3 has an open space 5 wherein the service module 2 fits as will be shown in subsequent FIGS. 4 and 5. The service module 2 includes a control panel 6 and a connection pole 7 for connecting the service model on an external power source. The loader model 3 may be provided with a door (not shown) in the side of the loader module faced away from the drawing, The door is provided to place a cassette with carrier of electronic components to be moulded in the loader module 3. The loader module 3 controls the movement of a loader head 10 as is shown in FIG. 2. The loader module 3 and the press module 4 are provided with wherein the system modules are provided with cooperating couplings 8 for mutual orientation and securing of adjacent system modules 3, 4. Inside the press module 4 a central space 9 is provided to locate guide elements as will be explained in more detail in FIG. 2.

FIG. 2 shows a perspective view on a loader head 10 and an off-loader head 11 including a guide structure 12 to guide the heads 10, 11 along a modular system for moulding electronic component. The loader head 10 is controlled by a loader module 3 (as depicted in FIG. 1) and the off-loader head 11 is to be controlled by an off-loader module as will be shown in FIGS. 4 and 5. The guide structure 12 is an in-line assembly of plural (in this figure four) guide parts 13-16. A first guide part 13 is to be included in the loader module 3, the second and third guide parts 14, 15 are to be incorporated in press modules 4 and the last guide part 16 is to be incorporated in an off-loader module. Dependent on the number and type of modules part of a specific modular system for moulding electronic components the length of the guide structure is to be selected.

Figure 3:
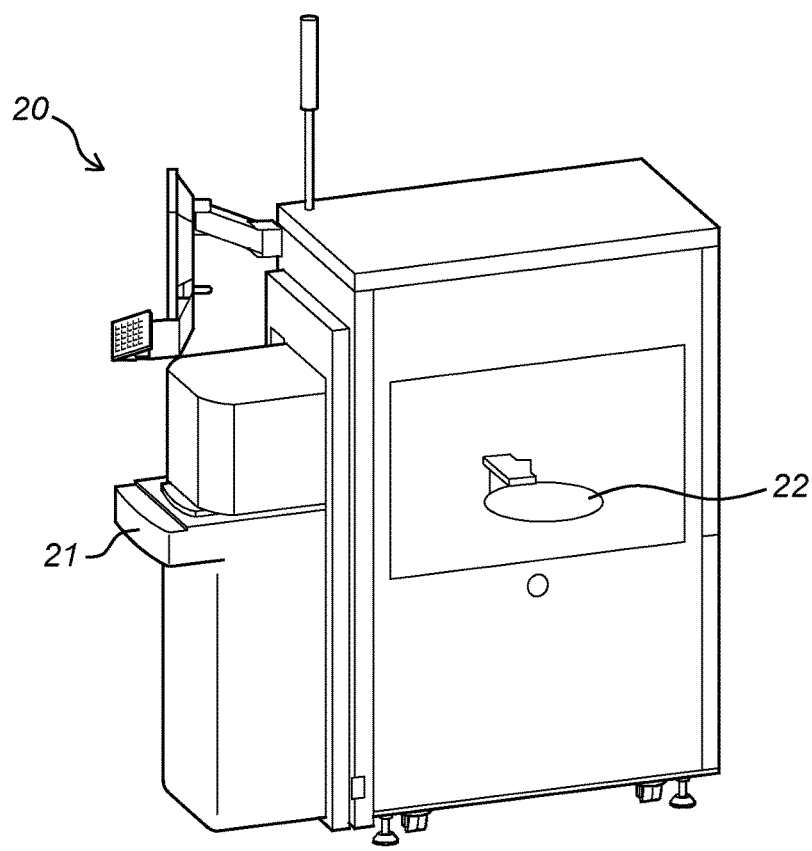
FIG. 3 a perspective view on a FOUP-loader.

FIG. 3 shows a FOUP-loader module 20 wherein enclosed cassettes 21 ("Front Opening Universal Product carrier") which enclosed cassettes 21 are used for storage of (vulnerable) wafers 22. A FOUP-loader module 20 is to be coupled with a loader module 3 as shown in FIG. 1. The FOUP-loader module 20 is designed to remove wafers 22 from the enclosed cassettes 21 and to present a selected wafer 22 sideward as is shown in this figure. The presented wafer 22 as shown will then be located inside an adjoining loader module 3 (not shown in this figure) to be handled with a loader haed 10 as shown in FIG. 2.

Figure 4:
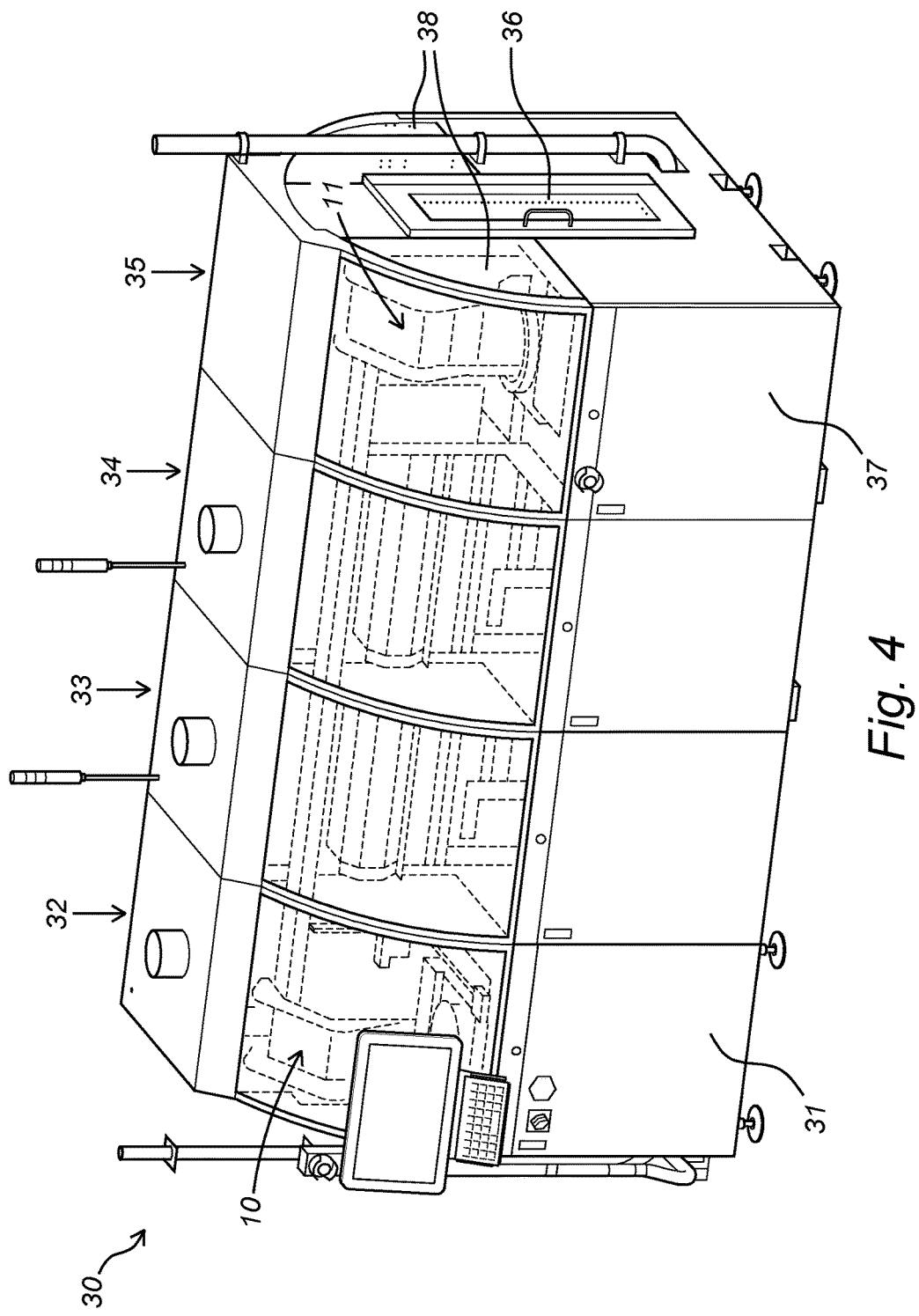
FIG. 4 a perspective view on a modular system for moulding electronic components according the present invention comprising a service module, a loader module, two press modules and an off-loader module.

FIG. 4 shows a perspective view on a modular system 30 for moulding electronic components according the present invention comprising a service module 31, a loader module 32, two press modules 33, 34 and an off-loader module 35. The modular system 30 is shown from the front side on which side the loader head 10 and off-loader head 11 may be moved along the modules 32-35. The modules 31-35 are coupled in an on-line configuration so the coupling elements 8 (not visible here; see FIG. 1) will now cooperate. Also shown is a door 36 in the off-loader module 35 that provides access to a cassette which is to be loaded with carrier of moulded electronic components so that the moulded product can be removed from the modular system. The off-loader module 35—as also the loader module 32 and the press modules 33, 34—is provided with a housing 37 of which the opposite sides are provided with coverable transfer openings 38. By opening these coverable transfer openings 38 a connection to an adjoining module may be made and in an end position (wherein an adjoining module to be coupled lacks) the transfer openings 38 will be covered.

Figure 5:
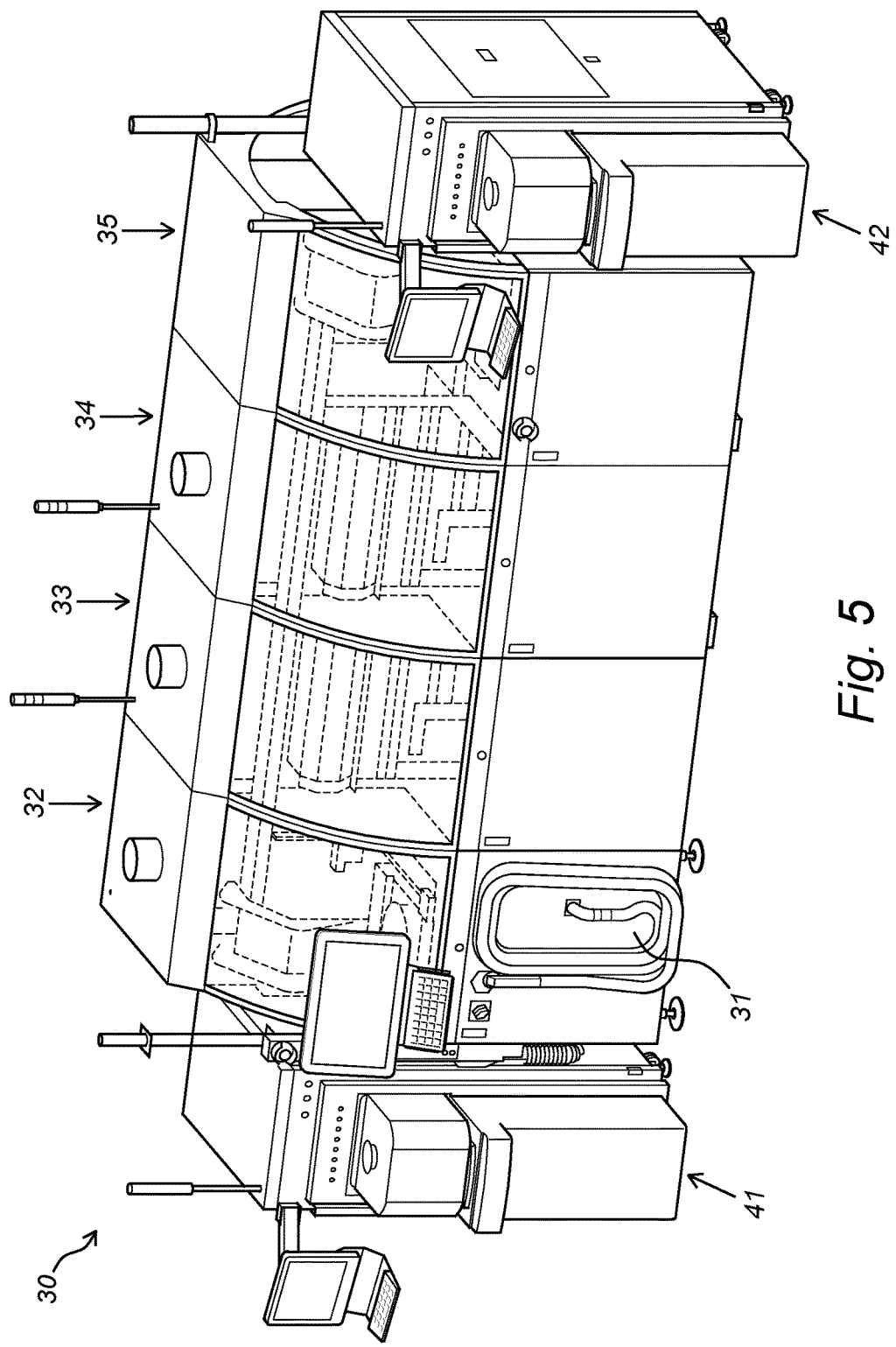
FIG. 5 a perspective view on an alternative embodiment of a modular system for moulding electronic components according the embodiment shown in FIG. 4 but also including a FOUP-loader module and a FOUP off-loader module.

FIG. 5 shows a perspective view on an alternative embodiment of a modular system 40 for moulding electronic components including all the modules as part of the modular system 30 shown in FIG. 4 but now also including a FOUP-loader module 41 and a FOUP off-loader module 42.

The invention claimed is:

1. A modular system for moulding electronic components, comprising at least three separate system modules, said system modules comprise a service module including an intelligent electronic control system and at least two further system modules comprising:
- at least one press module for moulding the electronic components, wherein the at least one press module comprises a press structure; and
- at least one loader module for loading the electronic components to be moulded from a cassette to the at least one press module,
- wherein the at least two further system modules are provided with cooperating couplings for orientation and securing of the at least two further system modules in-line and the intelligent electronic control system is configured to at least partially control each of the other further system modules,
- wherein the cooperating couplings of the at least one press module are an integral part of the press structure.

2. The modular system according to claim 1, wherein the system further comprises at least one off-loader module for off-loading moulded electronic components from the press into a cassette, which the at least one off-loader module is on at least one side provided with couplings for mutual orientation and securing the at least one off-loader module to a press module.

3. The modular system according to claim 1, wherein the system further comprises at least one feed module for feeding encapsulating material to a press module.

4. The modular system according to claim 1, wherein the system further comprises a FOUP-loader module for loading wafers with electronic components to be moulded, from a FOUP-carrier to an adjoining module.

5. The modular system according to claim 4, wherein the system further comprises a FOUP-off-loader module for offloading moulded wafers with electronic components from an adjoining module to a FOUP-cassette.

6. The modular system according to claim 1, wherein the at least one loader module comprises a loader head, which loader head is configured to extend into at least one press module.

7. The modular system according to claim 1, wherein the at least one press module is provided with a housing of which the opposite sides are provided with coverable transfer openings.

8. The modular system according to claim 2, wherein the at least one off-loader module comprises a cleaning and off-loader head, which cleaning and off-loader head is configured to extend into at least one press module.

9. The modular system according to claim 1, wherein the system includes at least two press modules.

10. The modular system according to claim 9, wherein the at least one press module is provided with cooperating guide parts.

11. The modular system according to claim 3, wherein the at least one feed module is integrated into at least one off-loader module.

12. The modular system according to claim 2, wherein the at least one press module, the service module, the at least one loader module and the at least one off-loader module have an identical width.

13. The modular system according to claim 5, wherein the at least one press module, the at least one loader module, the at least one off-loader module, the at least one feed module, the FOUP-loader and the FOUP-off-loader module are at least partially controlled by the service module.

14. The modular system according to claim 1, wherein the couplings comprise male and female coupling elements.

15. The modular system according to claim 1, wherein the at least one press module comprises on opposite sides of the module two couplings, which two couplings are horizontal.

16. The modular system according to claim 15, wherein all couplings of the at least three separate system modules are located in one horizontal plane.

17. A kit-of-parts for assembling the modular system for moulding electronic components, comprising a service module including an intelligent electronic control system and at least two further system modules comprising:
- at least one press module for moulding the electronic components, wherein the at least one press module comprises a press structure; and
- at least one loader module for loading the electronic components to be moulded from a cassette to a press module,
- wherein the at least two further system modules are provided with cooperating couplings for orientation and securing of the at least two further system modules in-line and the intelligent electronic control system is configured to at least partially control each of the other system modules,
- wherein the cooperating couplings of the at least one press module are an integral part of the press structure.

* * * * *